United States Patent [19]
Iwabuchi

[11] Patent Number: 6,008,543
[45] Date of Patent: *Dec. 28, 1999

[54] CONDUCTIVE BUMPS ON PADS FOR FLIP CHIP APPLICATION

[75] Inventor: Kaoru Iwabuchi, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/611,494

[22] Filed: Mar. 5, 1996

[30] Foreign Application Priority Data

Mar. 9, 1995 [JP] Japan .................................. 7-049353

[51] Int. Cl.⁶ .................................................. H01L 23/48
[52] U.S. Cl. ........................ 257/778; 257/737; 257/738; 257/779; 257/786
[58] Field of Search ...................................... 257/697, 737, 257/738, 786, 778, 779; 438/108, 613, 614

[56] References Cited

U.S. PATENT DOCUMENTS

| | | | |
|---|---|---|---|
| 4,087,314 | 5/1978 | George et al. ............................ | 156/643 |
| 4,792,532 | 12/1988 | Ohtani et al. ............................ | 257/786 |
| 4,994,902 | 2/1991 | Okahashi et al. ....................... | 257/697 |
| 5,036,163 | 7/1991 | Spielberger et al. .................... | 257/697 |
| 5,066,831 | 11/1991 | Spielberger et al. .................... | 257/786 |
| 5,220,199 | 6/1993 | Owada et al. ............................ | 257/786 |
| 5,327,013 | 7/1994 | Moore et al. ............................ | 257/738 |
| 5,440,453 | 8/1995 | Cooke et al. ............................ | 257/697 |
| 5,490,040 | 2/1996 | Gaudenzi et al. ....................... | 257/738 |
| 5,496,770 | 3/1996 | Park ......................................... | 257/738 |
| 5,504,277 | 4/1996 | Danner .................................... | 257/738 |
| 5,506,756 | 4/1996 | Haley ....................................... | 257/786 |
| 5,534,465 | 7/1996 | Frye et al. ............................... | 438/108 |
| 5,604,379 | 2/1997 | Mori ........................................ | 257/738 |
| 5,641,988 | 6/1997 | Huang et al. ............................ | 257/697 |
| 5,648,686 | 7/1997 | Hirano et al. ............................ | 257/737 |
| 5,656,863 | 8/1997 | Yasunaga et al. ....................... | 257/778 |
| 5,736,456 | 4/1998 | Akram ..................................... | 438/614 |
| 5,851,911 | 12/1998 | Farnworth ................................ | 438/614 |
| 5,903,058 | 5/1999 | Akram ..................................... | 257/778 |

FOREIGN PATENT DOCUMENTS 63-078555  4/1988  Japan .
3-250628  11/1991  Japan .

*Primary Examiner*—Donald L. Monin, Jr.
*Assistant Examiner*—Alonzo Chambliss
*Attorney, Agent, or Firm*—Hill & Simpson

[57] ABSTRACT

A semiconductor device including a semiconductor element having a plurality of pads, and a method of manufacturing the semiconductor device. The semiconductor element includes a plurality of wiring portions, each being conducted to one of the pads, which are formed on a pad-formed surface of the semiconductor element; and a plurality of bumps, each being formed at a specified position of one of the wiring portions. Accordingly, it is possible to solve the problem of difference in linear expansion coefficient between the semiconductor element and a circuit board and ensure a sufficient reliability; and to sufficiently make full use of the effect of high mounting density by flip chip mounting at a low cost.

5 Claims, 4 Drawing Sheets

F I G. 3a
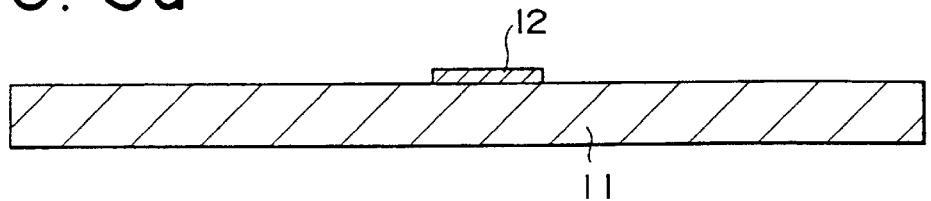
F I G. 3b
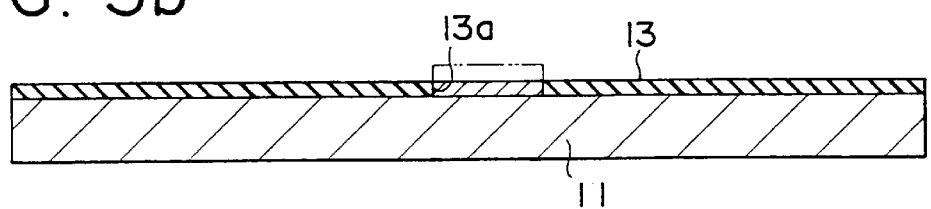
F I G. 3c
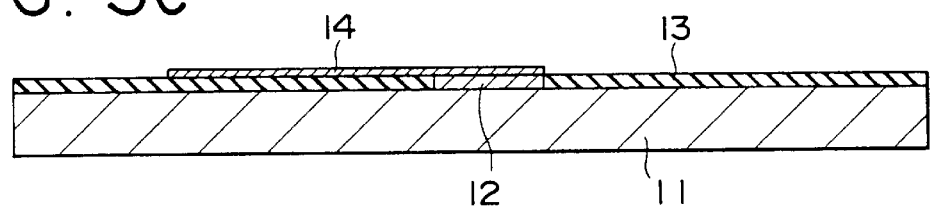
F I G. 3d
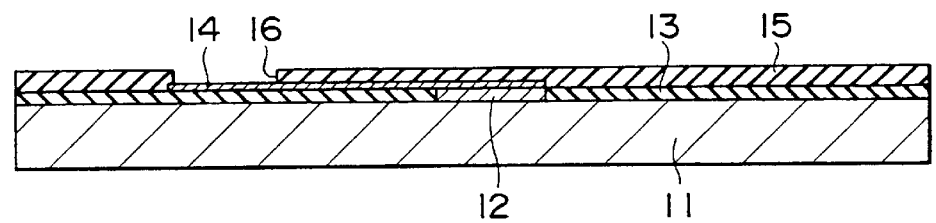
F I G. 3e
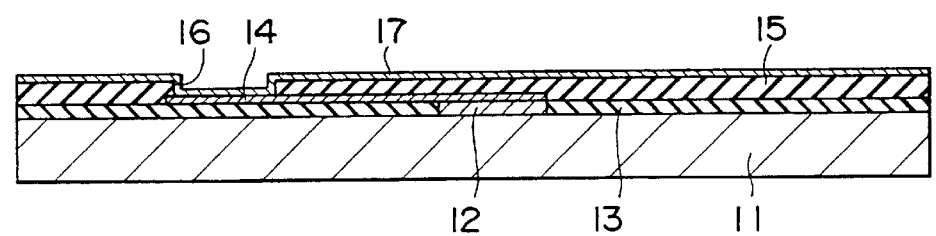

CONDUCTIVE BUMPS ON PADS FOR FLIP CHIP APPLICATION

BACKGROUND OF THE INVENTION

The present invention relates to a semiconductor device in which bumps conducted to pads are formed at arbitrary positions, and a method of manufacturing the semiconductor device.

A recent trend in semiconductor elements has been further toward high mounting density, high integration and high operating speed, and with such a trend, a technique has been required to mount the semiconductor elements on a circuit board at a high mounting density.

A method of mounting semiconductor elements on a circuit board has been known, wherein semiconductor elements are covered with a ceramic or plastic package for protection from an external environment, and are mounted on the circuit board using terminals protruded therefrom. In recent years, a BGA package has been emerged to further increase the high mounting density, and further, an examination has been actively made to put to practical use a flip chip mounting technique for forming bumps on a chip (semiconductor element) and connecting the chip on a circuit board through bumps in a face-down manner.

Methods of forming bumps by plating have been disclosed, for example in Japanese Patent Laid-open No. Hei 4-352429. Next, one example of the methods of forming bumps by plating will be described with reference to FIGS. 1a to 1d.

Referring first to FIG. 1a, a barrier metal layer 3 is formed on an Al pad 2 of a semiconductor element 1 by vapor deposition in such a manner as to cover the entire upper surfaces of the semiconductor element 1 and the Al pad 2.

A plating resist layer 4 is formed on the entire surface of the barrier metal layer 3, and only a portion, directly over the Al pad 2, of the resist layer 4 is opened as shown in FIG. 1b using the known lithography and etching techniques.

The surface, formed with the Al pad 2, of the semiconductor element 1 is dipped in an electrolytic solution, followed by current application, with a result that a mushroom-shaped solder bump 5 is formed at a position directly over the Al pad 2 as shown in FIG. 1c.

The resist layer 4 and a unnecessary portion of the barrier metal layer 3 are removed by acid using the solder bump 5 as a mask. The solder bump 5 is then applied with flux, and fused by heat-treatment, to form a spherical bump 5a shown in FIG. 1d.

As is well known, the flip chip mounting has the following disadvantage. A semiconductor element is generally different in linear expansion coefficient from a circuit board, and accordingly a solder bump is susceptible to stress concentration due to heat generated by operation of the semiconductor device. As a result, the solder bump is liable to be cracked, and finally it comes to an electrically open state, that is, it is disconnected.

It is well-known that a strain due to such thermal stress is based on a Coffin-Mason equation described, for example in a handbook titled "High Reliability Micro-soldering Technique" (pp. 275) published by Industrial Research Institute. Various measures have been made, on the basis of such a knowledge, for prolonging the service life of bumps thereby keeping a conducting state between a semiconductor element and a circuit board through the bumps. For example, it is known that the increased height of bumps is effective to prolong the service life of the bump and hence to keep a conducting connection between a semiconductor element and a circuit board through the bumps.

However, in semiconductor elements required for high density and high integration used in an ASIC (Application Specific Integrated Circuit) or the like, an interval between Al pads is narrowed because of a large number of output terminals. On the other hand, in the above-described plating method, a height of a bump 5 (5a) is limited by an interval between electrodes, that is, by an interval between Al pads 2, 2. Specifically, in the case of forming a spherical bump 5a having a height more than the above limitation, mushroom-shaped bumps 5 are formed in a state being continuous to each other, which results in an electric short-circuit between electrodes (Al pads 2,2), thus forming the bump 5a with a difficulty. For example, assuming that an interval between the Al pads 2, 2 is 150 μm and a practical thickness of a resist is 40 μm, a height of the bump 5a is limited to about 70 μm.

The prior art plating method, therefore, fails to form bumps on a semiconductor element on which Al pads are arranged at narrow intervals.

The above-described vapor deposition method is also inconvenient in that upon vapor deposition for forming bumps, a metal mask is heated by vapor deposition and is thereby warped, making accuracy of a bump forming position unsatisfactory. The vapor deposition method is, therefore, undesirable for forming bumps arranged at narrow pitches like the above-described plating method.

A method of relaxing a thermal stress due to differences in linear expansion coefficients has been known, wherein bumps are arranged in a staggered manner for dispersing stress concentration applied to bumps [Soga et al.: Journal of Japanese Institute of Electronic Information Communication vol. J70-C, No. 12 (December, 1987), pp. 1575–1582]. In this case, however, for a given number of output terminals, an layout area of the semiconductor element having Al pads that are arranged in a staggered manner must be made larger than that of a semiconductor element having Al pads arranged in rows and columns at nearly equal intervals. This is undesirable in terms of cost and mounting density.

The prior art flip chip mounting technique thus fails to sufficiently obtain high reliability.

An interval between electrode terminals in a circuit board mounting semiconductor elements is also limited to about 150 μm in terms of processing accuracy, and from this viewpoint, an interval between bumps cannot be also narrowed by the prior art flip chip mounting technique.

On the other hand, at present, an interval between Al pads in a semiconductor element is fine to less than 100 μm, and a technique is thus required to narrow the an interval between bumps up to a degree corresponding to the narrow interval between Al pads and to make full use of the effect of high mounting density by the flip chip mounting. However, under the existing circumstances, such requirement cannot be satisfied from the above-described reasons.

Finally, since at present an interval between electrode terminals in a circuit board is made narrower up to a to match the high mounting density of semiconductor elements, the semiconductor elements, when mounted on the circuit board, must be positioned relative thereto at a high accuracy. This requires a high precision equipment for satisfying the above accurate positioning, resulting in the increased cost.

OBJECT AND SUMMARY OF THE INVENTION

An object of the present invention is to provide a semiconductor device capable of solving problems which arise due to a difference in linear expansion coefficients between a semiconductor element and a circuit board for ensuring a sufficient reliability, and sufficiently making full use of the effect of high mounting density by flip chip mounting at a low cost; and to provide a method of manufacturing the semiconductor device.

To achieve the above object, according to a first aspect of the present invention, there is provided a semiconductor device including a semiconductor element having a plurality of pads, the semiconductor element comprising:

a plurality of wiring portions, each being conducted to one of the pads, which are formed on a pad-formed surface of the semiconductor element; and a plurality of bumps, each being formed at a specified position of one of the wiring portions.

According to a second aspect of the present invention, there is provided a method of manufacturing a semiconductor device for forming bumps to be electrically and mechanically connected to a circuit board on a semiconductor element having pads, comprising the steps of:

forming a first interlayer insulator on the semiconductor element, and opening portions, directly over the pads, of the first interlayer insulator for exposing the pads therefrom;

forming wiring portions, each having a pattern extending from one of the pads to a predetermined bump forming position on the semiconductor element, on the first interlayer insulator;

forming a second interlayer insulator on the first interlayer insulator in such a manner as to cover the wiring portions, and opening portions, directly over the predetermined bump forming positions, of the second interlayer insulator for exposing the wiring portions therefrom;

forming a conducting layer on the surface, formed with the second interlayer insulator, of the semiconductor element;

forming a plating resist layer on the conducting layer, and opening portions, directly over the predetermined bump forming positions, of the plating resist for exposing the conducting layer therefrom; and dipping the surface, formed with the plating resist layer, of the semiconductor element in an electrolytic solution, followed by current application, to thereby form bumps in the opening portions directly over the predetermined bump forming positions.

As described above, in a semiconductor element having a plurality of pads, a plurality of wiring portions, each being conducted to one of the pads, are formed on a pad-formed surface of the semiconductor element, and bumps are each formed at specified positions of the wiring portions. Accordingly, bumps can be arranged at arbitrary intervals irrespective of positions of the pads and intervals therebetween by previously setting the bump forming positions of the wiring portions. In other words, bumps having an arbitrary height can be formed. As a result, it becomes possible to suppress generation of a thermal fatigue of bumps due to a difference in thermal expansion coefficient between the semiconductor element and a circuit board, and hence to prolong the service life of the bumps. This is effective to perform flip chip mounting at a high reliability and to further enhance the effect of high density by flip chip mounting.

In the present invention, bumps can be formed at arbitrary positions, and accordingly it is possible to eliminate the necessity of strictly adhering a mounting accuracy as in the conventional manner by previously setting intervals between the bumps to be larger. Thus, when the semiconductor element is mounted on a circuit board, the bumps can be easily positioned to electrode terminals of the circuit board. This makes it possible to perform mounting with a sufficient reliability without use of a high accuracy equipment, and hence to prevent a failure in mounting resulting in reduced costs.

As described above, bumps can be formed at arbitrary positions, and consequently, even if an interval between pads is made narrower than an interval between electrode terminals of a circuit board because of a fine pitch arrangement of semiconductor elements, the semiconductor elements can be mounted on the circuit board at a high density.

In addition, according to the present invention, a semiconductor element having the conventional configuration can be mounted to a circuit board by flip chip mounting without changing the configuration. This eliminates the necessity of developing a new semiconductor element for high density mounting which would require a lot of time and a high cost. As a result, it is possible to perform high density mounting of semiconductor elements on a circuit board at a significantly lower cost.

BRIEF DESCRIPTION OF THE DRAWINGS

FIGS. 3a to 3g are process diagrams in side sectional view illustrating one embodiment of a method of manufacturing a semiconductor device of the present invention.

DETAILED DESCRIPTION OF THE PREFERRED EMBODIMENT

Hereinafter, preferred embodiments of the present invention will be described with reference to the accompanying drawings.

Figure 1A:
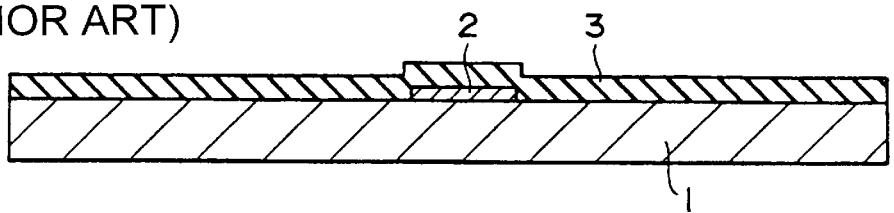
FIGS. 1a to 1d are process diagrams in side sectional view illustrating a prior art method of forming a bump.
Figure 1B:
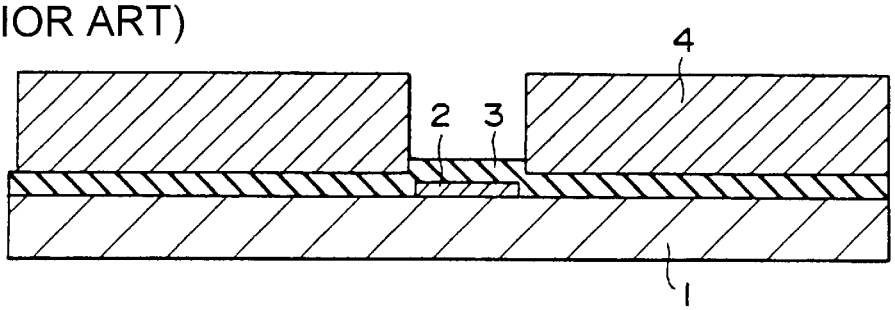
Figure 1C:
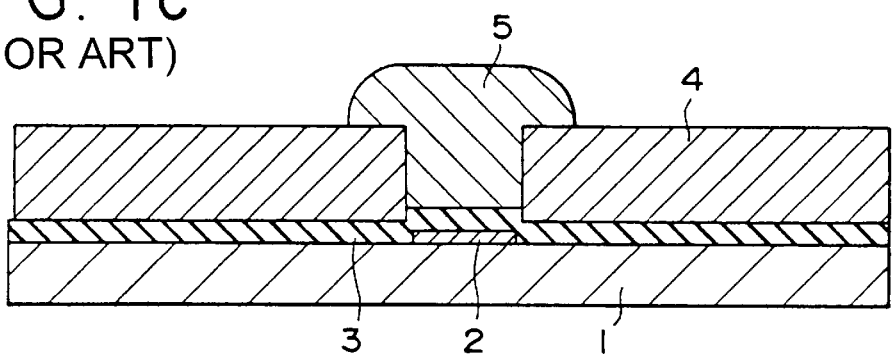
Figure 1D:
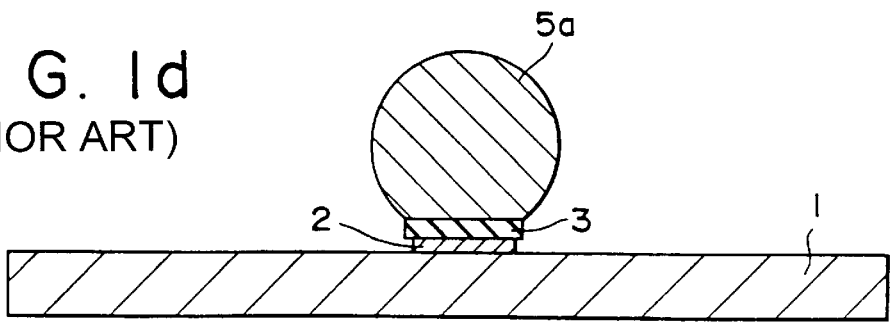
Figure 2A:
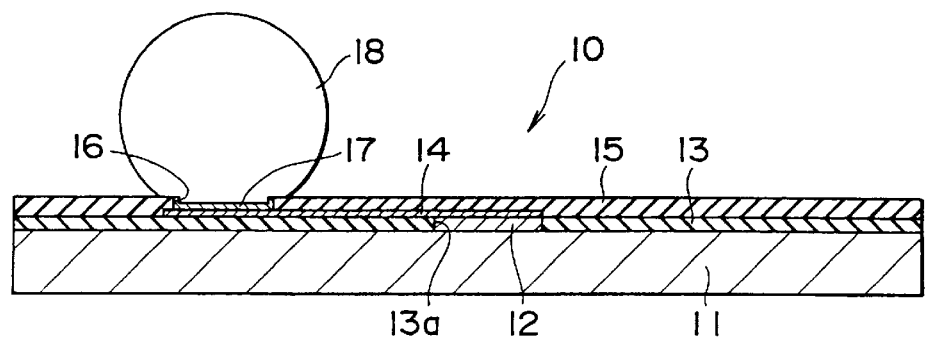
FIGS. 2a to 2c are schematic configuration views illustrating one embodiment of a semiconductor device of the present invention FIG. 2a being in side sectional view and FIGS. 2b and 2c being plan views.

FIG. 2a is a schematic view illustrating one embodiment of the semiconductor device of the present invention. In this figure, a reference numeral 10 indicates a semiconductor device, and a reference numeral 11 is a semiconductor element. The semiconductor element 11 is of a known type formed substantially into a square shape in a plan view. A plurality of pads 12, which are to be electrically and mechanically connected to a circuit board (not shown), are formed on one surface of the semiconductor element 11 in such a manner as to be spaced at specified intervals from one another. A first interlayer insulator 13 is formed on the semiconductor element 11 in such a manner as to cover the entire surface of the semiconductor element 11 except for the pads 12. The first interlayer insulator 13 is made of an inorganic or organic insulator for excluding an electric influence exerted between the semiconductor element 11 and wiring portions described later. It is to be noted that the first interlayer insulator 13 is formed to a thickness being nearly equal to that of the pad 12.

A plurality of wiring portions 14, each extending from the surface of the pad 12 to a specified position on the first interlayer insulator 13, are formed on the pads 12 and the first interlayer insulator 13. More specifically, the wiring portion 14 is formed such that a base portion thereof is provided on the pad 12 to be connected and a leading end portion thereof extends up to a predetermined bump forming position. The wiring portion 14 is formed of a laminated metal wiring made of, for example, Au/Cu/Ti or the like.

A second interlayer insulator 15 is formed on the wiring portions 14 and the first interlayer insulator 13. The second interlayer insulator 15 is made of an inorganic or organic insulator like the first interlayer insulator 13 for preventing the wiring portions 14 from being damaged.

An opening portion 16 for exposing part of the upper surface of the wiring portion 14 therefrom, is formed in the second interlayer insulator 15 at a position corresponding to the above-described predetermined bump forming position. A spherical bump 18 is formed on a conducting layer 17 on the upper surface of the wiring portion 14 that is exposed at the opening portion 16. The conducting which is made of a metal such as Cu or Au is provided as a base for forming the bump 18 (described later). The bump 18 is a projection for electrically and mechanically connecting the semiconductor element 11 to a circuit board. It is to be noted that although the bump 18 is generally formed of a solder such as an eutectic solder or a high melting point solder, it may be formed of a metal such as Ni or Cu, or of such a metal having a surface applied with noble metal plating.

Figure 2B:
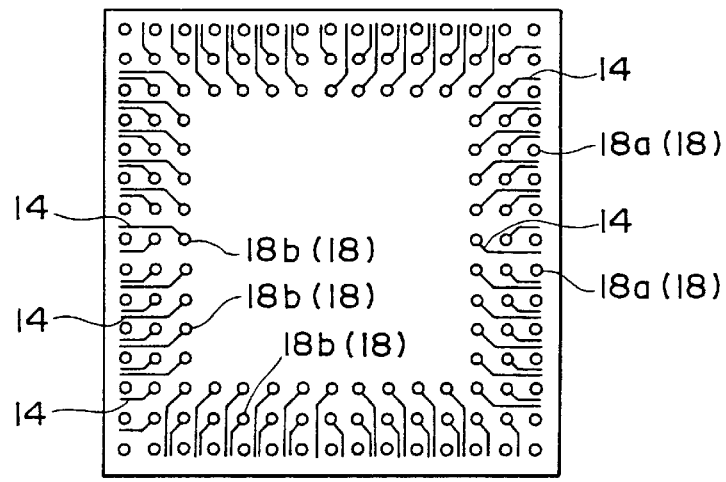

Such bumps 18 are arranged in three rows along the peripheral portion of the pad-formed surface of the semiconductor element 11 (see FIG. 2b). The bumps 18 arranged in three rows are classified into bumps 18a arranged in the outermost row at the periphery of the pad-formed surface and bumps 18b arranged in two rows on the inner portion of the pad-formed surface. The bumps 18a are formed so as to be conducted to those, of the pads 12 of the semiconductor element 11 which function as signal pins while the bumps 18b are formed so as to be conducted to those, of the pads 12 of the semiconductor element 11 which function as power supply pins. In addition, while not shown in the figure, the pads 12 are formed only on the peripheral portion of the semiconductor element 11, and accordingly, of the bumps 18, the bumps 18b are arranged in two rows on the inner portion from the periphery and are connected to the corresponding pads 12 formed on the peripheral portion through the corresponding wiring portions 14.

Figure 2C:
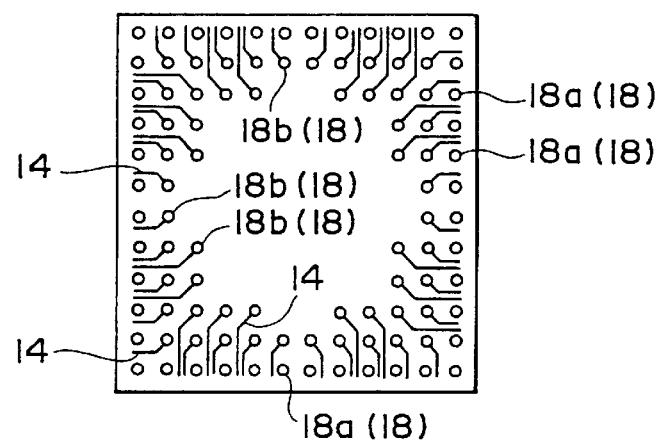

It is to be noted that the arrangement of the bumps 18 can be suitably changed in accordance with the configuration of a semiconductor element, that is, the shape thereof and the number of pins. For example, the bumps 18 may be arranged as shown in FIG. 2c. Even in the arrangement of the bumps 18 shown in FIG. 2c, the bumps arranged in the outermost row on the peripheral portion are formed so as to be conducted to the pads functioning as signal pins, and the bumps arranged in two rows on the inner portion are formed so as to be conducted to the pads functioning as power supply pins.

In the semiconductor device 10 having such a configuration, the bumps 18 are formed at predetermined positions so that they are connected to the pads 12 through the wiring portions 14. Accordingly the bumps 18 can be formed irrespective of the positions of the pads 12 and the intervals therebetween. In other words, the bumps, each having a predetermined height, can be easily formed in such a manner as to be arranged at predetermined intervals.

Since the first interlayer insulator 13 is formed on the semiconductor element 11, it is possible to prevent the semiconductor element 11 from causing a soft error due to α-rays discharged from the bumps 18 and the like, to prevent the pads 12 on the semiconductor element 11 from being damaged due to a difference in linear expansion coefficients between the pads 12 and components formed on the semiconductor element 11, and to reduce the stress applied on the lower portion of each bump 18. The semiconductor device 10 is thus effective to protect the semiconductor elements 11 and to keep the device operating properly for a long period.

In the semiconductor device 10, the bumps 18a conducted to the pads 12 functioning as signal pins are formed on the peripheral portion, while the pads 18b conducted to the pads 12 functioning as power supply pins are formed on the inner portion. Accordingly, upon mounting of the semiconductor element on a circuit board, a large number of signal wirings, which have been required to be connected from the circuit board resulting in the complicated wiring pattern, can be gathered at the peripheral portion of the circuit board; while only one power supply wiring may be disposed inside the circuit board. The wiring pattern of the circuit board can be thus made simple, and further the semiconductor device, after mounting on the circuit board, can be easily mounted on a computer or the like.

In the examples shown in FIGS. 2b and 2c, of the bumps 18, the bump 18a arranged in one row on the peripheral portion are conducted to the pads functioning as signal pins, while the pads 18b arranged in other rows are conducted to the pads functioning as power supply pins; however, the bumps 18 may be of course designed such that those arranged in two rows on the peripheral portion are conducted to the pads functioning as signal pins while the others are conducted to the pads functioning as power supply pins. Moreover, an arbitrary one of the bumps 18 positioned on the inner portion may be used as a dummy one for heat release.

Hereinafter, one embodiment of the method of manufacturing the semiconductor device 10 according to the present invention will be described.

Figure 3F:
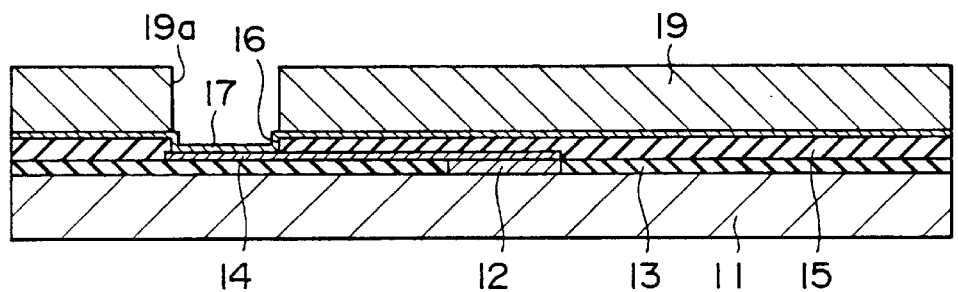

A semiconductor element 11 having a pad 12 made of Al was first prepared (see FIG. 3a). It is to be noted that FIG. 3a illustrates only one pad 12; however, the semiconductor element 11 has really a plurality of the pads 12 as described above, and in this embodiment, these pads 12 are spaced at intervals of 150 µm.

A first interlayer insulator 13 was formed on the surface, formed with the pad 12, of the semiconductor element 11 (see FIG. 3b). An opening portion 13a for exposing the pad 12 therefrom was formed in the first interlayer insulator 13 at a position directly over the pad 12. Specifically, for example, a photosensitive polyimide [trade name: UR-3100 (sold by Toray Industries)] was spin-coated on the semiconductor element 11, to form an insulating film having a thickness of about 5 µm, and the insulating film was pre-baked for 2 minutes at 100° C., to form a first interlayer insulator 13. The first interlayer insulator 13 was exposed using an exposure mask previously prepared, followed by development, to remove a portion shown by a two-dot chain line in FIG. 3b, thus forming an opening portion 13a for exposing the upper surface of the pad 12 therefrom.

A wiring portion 14, having a pattern extending from the pad 12 to a predetermined bump forming position on the semiconductor element 11, was formed on the first interlayer insulator 13 (see FIG. 3c). Specifically, a resist [trade name: OPR-800 (sold by Tokyo Ohka)] was spin-coated on the first interlayer insulator 13 to a thickness of about 5 µm, and pre-baked for 90 seconds at 100° C. The pre-baked resist layer was then exposed using an exposure mask previously prepared, followed by development, to form a negative pattern of a wiring portion extending from the pad 12 to a predetermined bump forming position. A Ti layer (thickness: 0.1 μm), a Cu layer (0.5 μm), and an Au layer (0.1 μm) were sequentially laminated over the surface of the resist layer in this order by vapor deposition such as sputtering, to form a barrier metal layer having a laminated structure of Ti/Cu/Au. After that, the surface, formed with the barrier metal layer, of the semiconductor element 11 was dipped in a resist separating liquid for dissolving the resist layer, to remove part, formed on the resist layer, of the barrier metal layer. The remainder of the barrier metal layer is taken as a wiring portion 14.

A second interlayer insulator 15 was formed on the first interlayer insulator 13 in such a manner as to cover the wiring portion 14, and an opening portion 16 for exposing the wiring portion 14 therefrom was formed in the second interlayer insulator 15 at a position directly over the above-described predetermined bump forming position (see FIG. 3d). Specifically, a photosensitive polyimide [trade name: UR-3100 (sold by Toray Industries)] was spin-coated on the first interlayer insulator 13, to form an insulating film having a thickness of about 5 μm. The insulating film was pre-baked for 2 minutes at 100° C., to form a second interlayer insulator 15. The second interlayer insulator 15 was exposed using an exposure mask previously prepared, followed by development, to form an opening portion 16 with a circular opening surface having an inside diameter of 80 μm.

A Cu layer (thickness: 1.0 μm) and an Au layer (0.1 μm) were sequentially laminated in this order on the surface, formed with the second interlayer insulator 15, of the semiconductor element 11 by vapor deposition such as sputtering, to form a conducting layer 17 having a laminated structure of Cu/Au (see FIG. 3e). The reason why the Au layer is formed is to prevent oxidation of the Cu layer.

A plating resist layer 19 was formed on the conducting layer 17, and an opening portion 19a for exposing the conducting layer 17 therefrom was formed in the plating resist layer 19 at a position directly over the above-described predetermined bump forming position, that is, directly over the opening portion 16 of the second interlayer insulator 15. Specifically, a plating resist [trade name: PMER MR-19 (sold by Tokyo Ohka)] was spin-coated to form a plating resist layer 19 having a thickness of about 40 μm. The plating resist layer 19 was then exposed using the same exposure mask as that used for processing the second interlayer insulator 15, followed by development, to form an opening portion 19a patterned into a circular shape having an inside diameter of 80 μm. It is to be noted that the opening portion 19a is in registration with the opening portion 16.

Figure 3G:
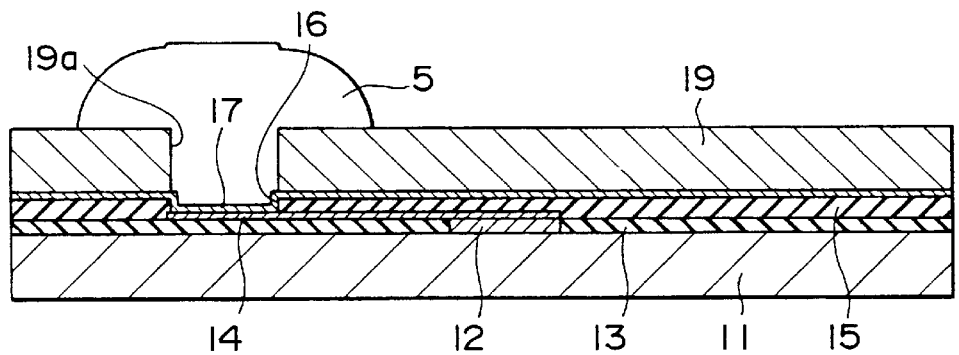
Figure 4A:
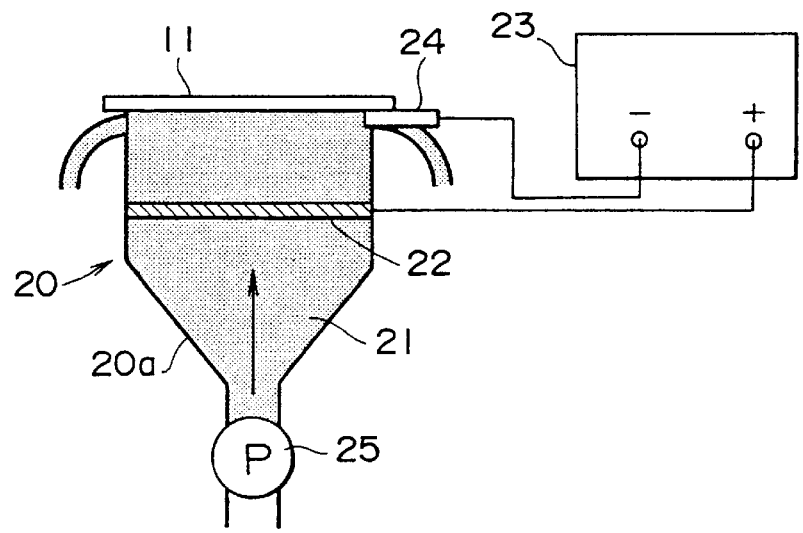
FIG. 4a is a schematic configuration view illustrating an electroplating apparatus.

Next, the semiconductor element 11 formed with the plating resist layer 19 was dipped in an electrolytic solution 21 of an electroplating apparatus 20 shown in FIG. 4a, followed by current application, to form a mushroom-shaped solder bump 5 at the position directly over the above-described predetermined bump forming position, that is, in the opening portion 19a of the plating resist layer 19 as shown in FIG. 3g. Here, the electroplating apparatus 20 has such a known configuration that the electrolytic solution 21 is stored in a main body 20a of the apparatus 20, and an anode 22 made of a Pt/Ti mesh electrode is disposed in the electrolytic solution 21. The anode 22 is connected to a power supply 23, while a cathode power feed portion 24 having a pin functioning as a cathode electrode (not shown) is also connected to the power supply 23.

A method of forming a bump 5 using such an electroplating apparatus 20 will be described below. The surface, formed with the plating resist layer 19, of the semiconductor element 11 was dipped in the electrolytic solution 21 of the electroplating apparatus 20. In such a state, the pin of the cathode power feed portion 24 was brought in press-contact with the semiconductor element 11 to the extent that the pin broke through the resist layer 19 and was conducted to the conducting layer 17 of the semiconductor element 11. A negative current of 1.5 A/dm$^2$ was then applied from the power supply 23 to the conducting layer 17 through the cathode power feed portion 24, and the electrolytic solution 21 [trade name: LD-5 (sold by Ishihara Chemical)] was jetted from a pump 25 provided on the electroplating apparatus 20. In such a state, plating was performed for 3 hours at room temperature. As a result, a solder (Pb:Sn=95:5) was plated on part of the conducting layer 17 exposed from the opening portion 19a of the plating resist layer 19 and from the opening portion 16 of the second interlayer insulator 15, to form a mushroom-shaped solder bump 5 having a height of 100 μm.

After that, the plating resist layer 19 remaining on the semiconductor element 11 formed with the solder bump 5 was dissolved and removed by acetone, and part of the conducting layer 17 exposed by removal of the plating resist layer 19 was removed by an etching solution. In addition, as the etching solution for removing the conducting layer 17, a mixed solution ($NH_4I+I_2+CH_3COOH$) was used for removing the Au layer forming the conducting layer 17, and a mixed solution ($NH_4OH+H_2O_2+EDTA$) was used for removing the Cu layer forming the conducting layer 17.

After the etching for the conducting layer 17, the surface of the semiconducting element 11, that is, the second interlayer insulator 15 was spin-coated with a flux [trade name: RH-5186 (sold by Japan Alpha Metal)], and heat-treated on a hot plate for 30 seconds at 350° C. for melting the mushroom-shaped solder bump 5, to form a spherical bump 18 having a height of 100 μm as shown in FIG. 2a, thus completing the manufacturing processes for the semiconductor device 10.

It is to be noted that another layout of bumps 18 different from that of the bumps 18 shown in FIGS. 2b and 2c can be obtained using such a manufacturing method. For example, 240 bumps, each having a height of 100 μm, were formed in such a manner as to be spaced at intervals of 500 μm in a matrix.

In the above-described method of manufacturing the semiconductor device 10, a bump 18 is formed on a wiring portion 14 conducted to a pad 12 at a position directly over a predetermined bump forming position. In other words, bumps 18 can be arranged at arbitrary positions spaced at arbitrary intervals irrespective of positions of pads 12 and intervals therebetween. Each bump 18 having an arbitrary height can be thus formed. Accordingly, it becomes possible to suppress generation of thermal fatigue of bumps due to a difference in thermal expansion coefficient between the semiconductor element 11 and a circuit board, and hence to prolong the service life of the bumps.

Since the bumps 18 are formed at arbitrary positions, they can be arranged at sufficiently large intervals. As a result, when the semiconductor element 11 is mounted on a circuit board, the positioning therebetween can be easily performed.

The semiconductor element 11 having a conventional configuration can be mounted on a circuit board by flip chip mounting without changing the configuration.

In the embodiment, the insulator made of polyimide is used as the first interlayer insulator 13 and the second interlayer insulator 15; however, it may be replaced with an inorganic material represented by a nitride film made of $SiN_x$ or the like. In this case, the openings 13a, 16 may be formed by the known method of carrying out lithography, etching or the like using a resist.

The barrier metal layer may be made of Cr/Cu/Au in place of Ti/Cu/Au described in the embodiment.

In the embodiment, the wiring portion 14 is formed by the steps of forming a resist on a first interlayer insulator 13; forming a negative pattern of the wiring portion 14 on the resist; forming a barrier metal layer; and dissolving and removing the resist layer. This method, however, may be replaced another one which includes the steps of forming a barrier metal layer on a first interlayer insulator 13 and a pad 12; forming a resist layer, followed by exposure and development, to form a positive pattern of a wiring portion 14; removing a unnecessary portion of the barrier metal layer by etching using acid or the like; and removing the resist layer using a resist separating solution, thereby forming the wiring portion 14.

The method of forming the mushroom-shaped bump 5 using the electroplating apparatus 20 described in the embodiment may be replaced with the following one.

A sulfamine nickel heated at 40° C. is used as the electrolytic solution 21 in place of the LD-5 (trade name, sold by Ishihara Chemical). The sulfamine nickel is jetted by the pump 25, and at the same a minus current of $1.0 \text{ A/dm}^2$ is applied from the power supply 23 to the conducting layer 17 through the cathode power feed portion 24 as in the embodiment, to form a mushroom-shaped nickel bump having a height of 50 $\mu$m. Next, the electroplating is performed again using gold sulfite as the electrolytic solution 21, to form a gold plating film having a thickness of 0.1 $\mu$m on the nickel bump already formed.

With this method, since the gold plating film is formed on the bump, the bump has excellent in resistance to oxidation, to thereby further prolong the service life of the bump.

While the preferred embodiments of the present invention have been described, such description is for illustrative purposes only, and it is to be understood that changes and variations may be made without departing the spirit or scope of the following claims.

What is claimed is:

1. A semiconductor device, comprising:

a semiconductor element having a plurality of pads;

a first insulator layer over said semiconductor element, said first insulator layer forming openings at said pads wherein only top surfaces of said pads remain exposed;

a plurality of wiring portions, each of said wiring portions being connected to one of said pads at corresponding ones of said openings and extending laterally thereto;

a second insulator layer on said first insulator layer and on said wiring portions, said second insulator layer forming openings at said wiring portions at positions laterally remote from said pads;

a conducting layer formed within each of said second insulator layer openings so as to completely contact inner edges of said second insulator layer openings, said conducting layer being directly connected to each of said wiring portions at respective second insulator layer openings and having a height no greater than a height of said second insulator layer; and a plurality of bumps of conductive material, each of said bumps being formed at one of said openings in said second insulator layer and being directly connected to said conducting layer so that each of said bumps is conductively connected to a corresponding one of said wiring portions.

2. A semiconductor device according to claim 1, wherein said bumps are classified into two groups, one group of said bumps being each in contact with those of said pads functioning as signal pins and being arranged on a peripheral portion of said semiconductor element, while the other group of said bumps being each in contact with those of said pads functioning as power supply pins and being arranged on an inner portion of said semiconductor element.

3. A semiconductor device as claimed in claim 1, further comprising:

further pads on said semiconductor element;

said first and second insulator layers forming further openings at said further pads in registration with one another; and further bumps at said further openings in electrical contact with said further pads and positioned over said further pads.

4. A semiconductor device as claimed in claim 1, wherein said bumps include peripheral bumps adjacent a periphery of said semiconductor element and inside bumps spaced from the periphery of said semiconductor element.

5. A semiconductor device as claimed in claim 4, wherein said peripheral bumps are connected through said wiring portions to said pads carrying signals to said semiconductor element and said inside bumps are connected through said wiring portions to said pads carrying power to said semiconductor element.

* * * * *